(12) United States Patent
Hung et al.

(10) Patent No.: US 11,855,076 B2
(45) Date of Patent: Dec. 26, 2023

(54) ELECTROSTATIC DISCHARGE (ESD) ARRAY WITH BACK END OF LINE (BEOL) CONNECTION IN A CARRIER WAFER

(71) Applicant: Taiwan Semiconductor Manufacturing Co., Ltd., Hsin-Chu (TW)

(72) Inventors: Tao-Yi Hung, Hsin-Chu (TW); Wun-Jie Lin, Hsinchu (TW); Jam-Wem Lee, Hsinchu (TW); Kuo-Ji Chen, Wu-Ku (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 387 days.

(21) Appl. No.: 17/150,782

(22) Filed: Jan. 15, 2021

(65) Prior Publication Data

US 2022/0231010 A1 Jul. 21, 2022

(51) Int. Cl.
*H01L 27/02* (2006.01)
*H02H 9/04* (2006.01)

(52) U.S. Cl.
CPC ...... *H01L 27/0288* (2013.01); *H01L 27/0255* (2013.01); *H01L 27/0266* (2013.01); *H02H 9/046* (2013.01)

(58) Field of Classification Search
CPC ..... H01L 24/01; H01L 27/02; H01L 27/0203; H01L 27/0248; H01L 27/0251; H01L 27/0255; H01L 27/0266; H01L 27/0288; H01L 27/0292; H01L 27/0296; H01L 29/66; H01L 29/66007; H01L 29/66075; H01L 29/66083; H01L 29/6609; H01L 29/66098; H01L 29/66106; H01L 29/66227; H01L 29/66363; H01L 23/60; H01L 23/62; H02H 9/04; H02H 9/046
USPC ........................................................ 438/133
See application file for complete search history.

(56) References Cited

U.S. PATENT DOCUMENTS

| | | | |
|---|---|---|---|
| 2009/0283898 A1* | 11/2009 | Janzen | H01L 25/0657 257/E21.597 |
| 2012/0153437 A1* | 6/2012 | Chen | H01L 27/0296 257/E29.019 |
| 2014/0268448 A1* | 9/2014 | Tseng | H01L 25/0657 438/109 |
| 2015/0250058 A1* | 9/2015 | Ramachandran | H01L 27/12 361/748 |
| 2016/0307884 A1* | 10/2016 | Weyers | H01L 29/0619 |
| 2019/0057950 A1* | 2/2019 | Mueller | H01L 24/19 |
| 2020/0058646 A1* | 2/2020 | Gomes | H01L 29/785 |
| 2021/0296889 A1* | 9/2021 | Walker | H01L 27/0292 |

\* cited by examiner

*Primary Examiner* — Wasiul Haider
(74) *Attorney, Agent, or Firm* — Duane Morris LLP

(57) ABSTRACT

An electrostatic discharge (ESD) protection apparatus and method for fabricating the same are disclosed herein. In some embodiments, the ESD protection apparatus, comprises: an internal circuit patterned in a device wafer and electrically coupled between a first node and a second node, an array of electrostatic discharge (ESD) circuits patterned in a carrier wafer, where the ESD circuits are electrically coupled between a first node and a second node and configured to protect the internal circuit from transient ESD events, and where the device wafer is bonded to the carrier wafer.

20 Claims, 7 Drawing Sheets

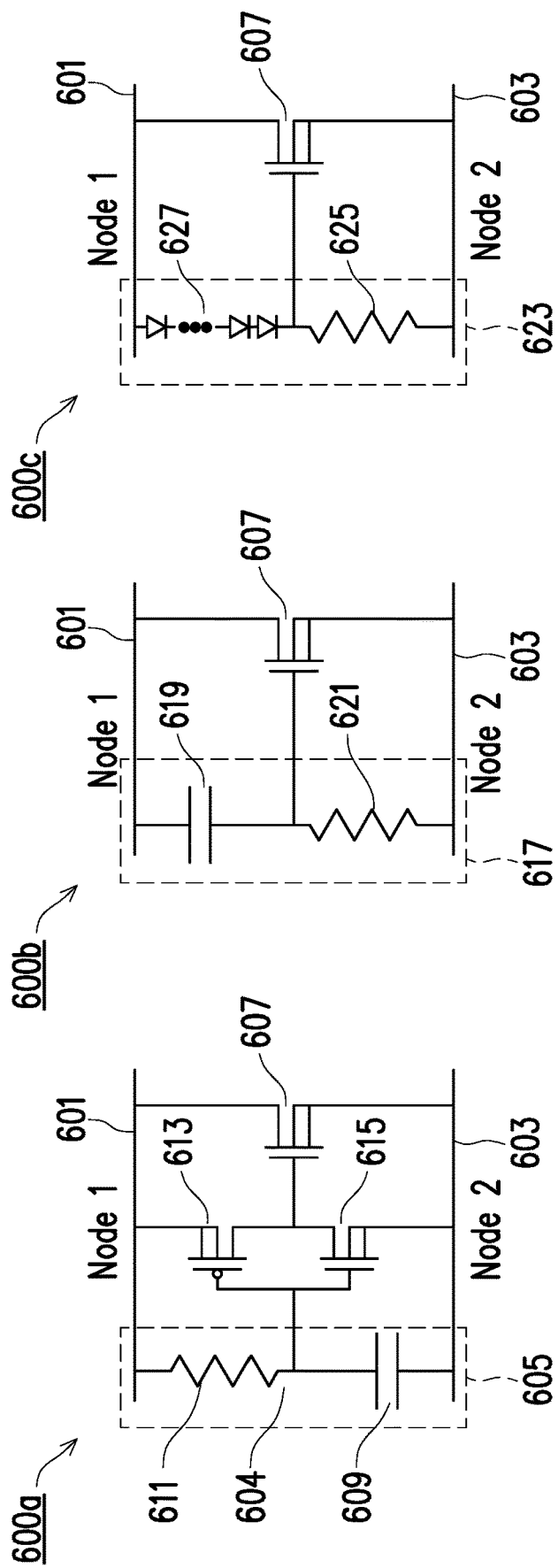

ELECTROSTATIC DISCHARGE (ESD) ARRAY WITH BACK END OF LINE (BEOL) CONNECTION IN A CARRIER WAFER

BACKGROUND

With the advance of integrated circuit (IC) fabrication technologies, more and more circuit blocks are integrated in a single chip. As such, in applications utilizing integrated circuits formed in a single chip, the interface circuits can be exposed to a transient electrical event, or an electrical signal of a relatively short duration having rapidly changing voltage and power. Transient electrical events can include, for example, electrostatic discharge (ESD) events arising from the abrupt release of charge from an object or person to an IC chip.

Moreover, the ESD events may stress the interface circuits inside the IC due to overvoltage conditions and high levels of power dissipation over relatively small areas of the IC. For example, high power dissipation can increase IC temperature, and can also lead to other problems, such as gate oxide punch-through, junction damage, metal damage, and surface charge accumulation. Moreover, the ESD can induce latch-up (inadvertent creation of a low-impedance path), thereby disrupting the functioning of the IC and potentially causing permanent damage to the IC from self-heating in the latch-up current path.

That is why, the design of an efficient (area, power, speed) ESD protection network is among the one of the most critical reliability issues for integrated circuits (IC) manufacturing. In particular, the ICs are more vulnerable to an ESD stress as semiconductor fabrication technologies advance into the deep sub-micron (DSM) process, scaled-down devices, thinner gate oxides, lightly-doped drain regions (LDD), shallow trench isolation (STI) process and the metallic salicide process.

However, an ESD protection network typically consumes a large on-chip area and is limited to a semiconductor fabrication technology used to fabricate an IC. Thus, there is a need to provide a semiconductor structure for an ESD protection network that reduces on-chip layout area while providing protection against the ESD effects.

The information disclosed in this Background section is intended only to provide context for various embodiments of the invention described below and, therefore, this Background section may include information that is not necessarily prior art information (i.e., information that is already known to a person of ordinary skill in the art). Thus, work of the presently named inventors, to the extent the work is described in this background section, as well as aspects of the description that may not otherwise qualify as prior art at the time of filing, are neither expressly nor impliedly admitted as prior art against the present disclosure.

BRIEF DESCRIPTION OF THE DRAWINGS

Various exemplary embodiments of the present disclosure are described in detail below with reference to the following Figures. The drawings are provided for purposes of illustration only and merely depict exemplary embodiments of the present disclosure to facilitate the reader's understanding of the present disclosure. Therefore, the drawings should not be considered limiting of the breadth, scope, or applicability of the present disclosure. It should be noted that for clarity and ease of illustration these drawings are not necessarily drawn to scale.

FIG. 6A-6C illustrates exemplary embodiments of ESD power clamp circuits, in accordance with some embodiments.

DETAILED DESCRIPTION

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

Figure 1:
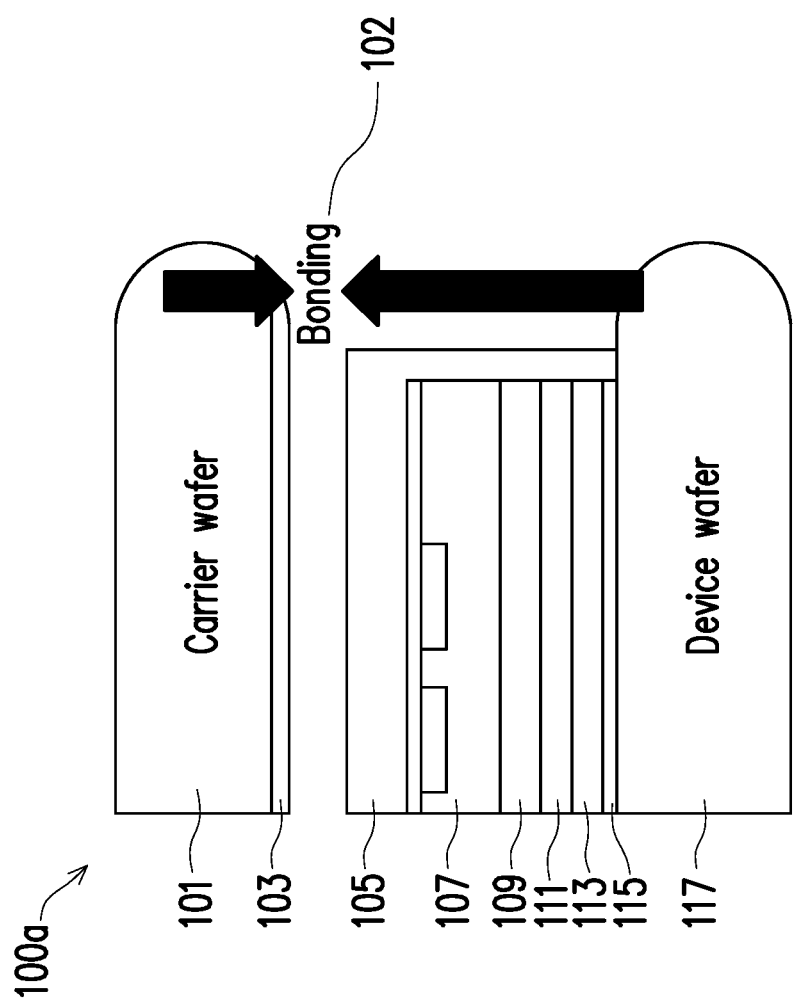
FIG. 1 illustrate a cross-sectional views of exemplary wafer stack for implementing ESD protection circuitry in a carrier wafer, in accordance with some embodiments of the present disclosure.

FIG. 1 illustrates a cross-sectional view of an exemplary wafer stack 100a for implementing ESD protection circuitry in a carrier wafer 101 according to some embodiments. In some embodiments, during the bonding process 102, the front surfaces of the carrier wafer 101 and a device wafer 117 are placed in contact with one another and bonded via thermal compression bonding. In some exemplary wafer stack formation process, the carrier wafer 101 may be bonded to a High Density Plasma (HDP) oxide layer 105 during a wafer bonding process 102. In further embodiments, the carrier wafer, having an array of ESD protection circuits patterned within, may include insulating materials such as silicon dioxide ($SiO_2$) deposited on its front surface. As described above, the front surface of the carrier wafer 101 having a thin insulating material 103 deposited on its surface may be bonded with the surface of the device wafer 117. In some embodiments, the thin insulating material 103 may have a thickness of approximately 350 angstroms (Å).

In some embodiments, the wafer stack 100a for implementing ESD protection circuitry in the carrier wafer 101 may use a back end-of-line ("BEOL") fabrication process to fabricate a first conductive interconnect layer 107. As such, the first conductive interconnect layer 107 may be used to interconnect components of integrated circuits (ICs) and other microdevices patterned on the device wafer 117. In other embodiments, the first conductive interconnect layer 107 may include contacts (pads), interconnect wires, and vertical conductive paths (vias) suitable for interconnecting the integrated circuits (ICs) and other microdevices patterned on the device wafer 117 to the array of the ESD protection circuits patterned on the carrier wafer 101. In further embodiments, the BEOL fabrication process may use a conductive material, such as aluminum (Al), copper (Cu) or a Cu-based alloy, to create metallization lines and vias in the first conductive interconnect layer 107. Moreover, in deep-submicron BEOL processes, the conductive interconnect layer 107 may be insulated using the HDP oxide 105 that exhibits a good gap filling capability, low dielectric constant, and a low defect density. In some embodiments, the first conductive interconnect layer 107 may have a thickness of approximately 28,000 to 30,000 Å. In some embodiments, the thickness of the first conductive interconnect layer 107 may be based on the number of metal layers deposited during the BEOL processes.

In further embodiments, the wafer stack 100a may use a mid-end-of-line ("MEOL") fabrication process to fabricate a second conductive interconnect layer 109. In some embodiments, the second conductive interconnect layer 109 may include gate contacts as well as contact structures in the source and drain regions of the device wafer 117. In various embodiments, the second conductive interconnect layer 109 may have a thickness of in the range of 450 to 550 Å (e.g., 500 Å). In some embodiments, the thickness of the second conductive interconnect layer 109 may depend on a semiconductor fabrication process.

As shown in FIG. 1, the wafer stack 100a may include a layer of epitaxial growth and a first interlayer dielectric (ILD) 111. In some embodiments, the first ILD may be, for example, an oxide, i.e. SiO2, or a low k dielectric material, which may be deposited using any conventional deposition process, for example, atomic layer deposition (ALD), chemical vapor deposition (CVD), or physical layer deposition (PVD). In various embodiments, the layer of epitaxial growth and the ILD may have a thickness in the range of 1100 to 1300 (e.g., 1200) Å. In some embodiments, the thickness of the IDL layer may depend on a semiconductor fabrication process.

In further embodiments, the wafer stack 100a may include a silicon (Si) layer 113 formed on top of an insulator layer 115 deposited over the substrate of the device wafer 117. In various embodiments, the Si layer 113 may include a crystalline silicon. As such, semiconductor devices, such as transistors, may be capable of being fabricated in the crystalline silicon. In some embodiments, the Si layer 113 may have a thickness in the range of 350 to 450 Å (e.g., 400 Å) and the insulator layer 115 may have a thickness in the range of 180 to 220 Å (e.g., 200 Å). In various embodiments, the wafer stack 100a may also be flipped to facilitate a flip-chip packaging. In some embodiments, the thickness of the insulator layer 115 may depend on a semiconductor fabrication process.

Figure 2:
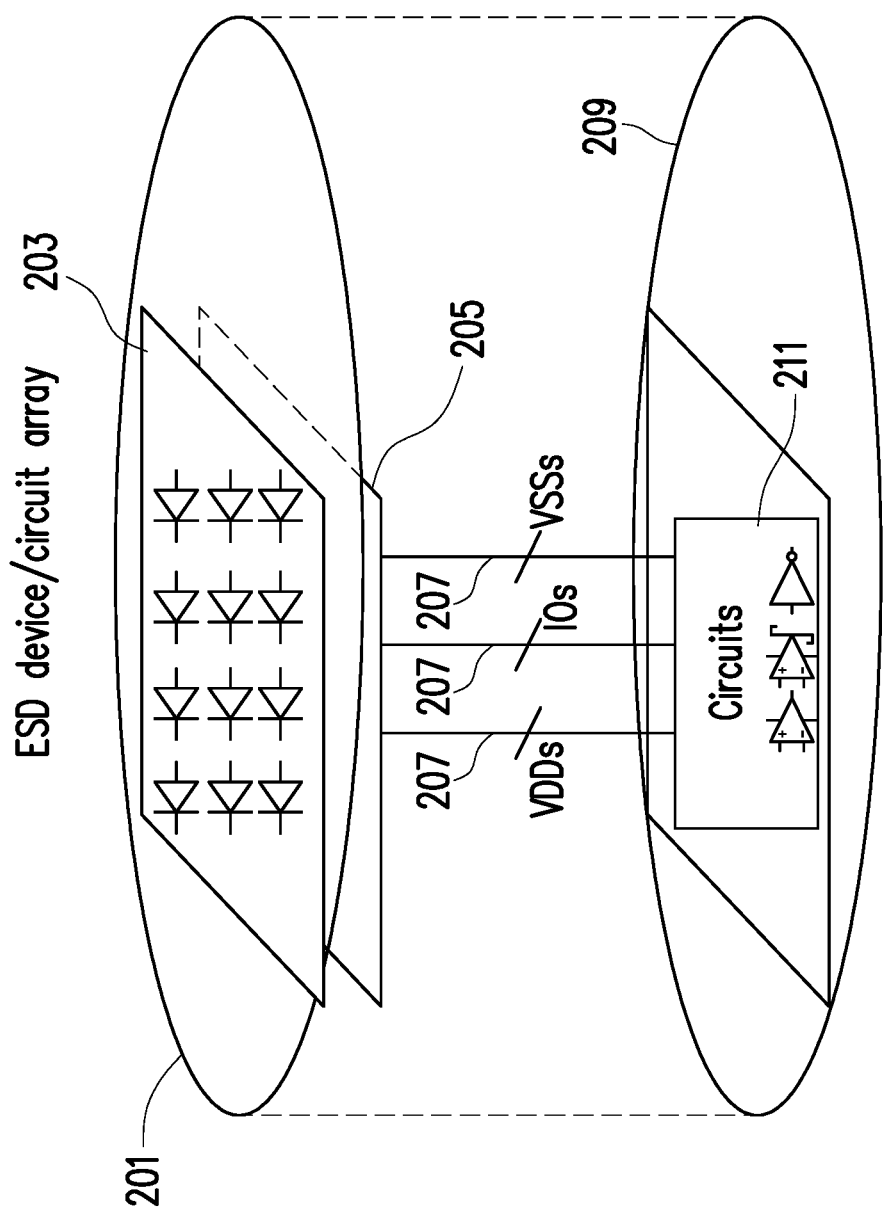
FIG. 2 illustrates a schematic diagram of an ESD circuit array implemented in a carrier wafer, in accordance with some embodiments of the present disclosure.

FIG. 2 illustrates a schematic diagram of an array of ESD protection circuits 203 implemented in a carrier wafer 201, in accordance with some embodiments of the present disclosure. In some embodiments, the array of ESD protection circuits 203 may be patterned on the carrier wafer 201 and configured to divert damaging ESD pulses from an array of sensitive devices 211 patterned on a device wafer 209. Moreover, the array of ESD protection circuits 203 patterned on the carrier wafer 201 may save a critical device wafer area for various integrated circuits and microdevices by fabricating large ESD protection circuits on the carrier wafer 201.

In various embodiments, the carrier wafer 201 may be fabricated from various materials including silicon, soda lime glass, borosilicate glass, sapphire, and various metals and ceramics. Moreover, the carrier wafer 201 may be square or rectangular and may be sized to match the device wafer 209. The device wafer 209 includes the array of devices 211 comprising of integrated circuits, MEMS, microsensors, power semiconductors, light-emitting diodes, photonic circuits, interposers, embedded passive devices, and other microdevices fabricated on or from silicon and other semiconducting materials such as silicon-germanium, gallium arsenide, and gallium nitride. In further embodiments, the array of devices 211 can also include raised structures such as solder bumps and metal posts and pillars.

In some embodiments, the array of ESD protection circuits 203 patterned on the carrier wafer 201 may include ESD clamp circuits discussed with respect to FIGS. 4A, 4B, 5A, 5B, 6A, 6B, and 6C below or any other ESD protection circuitry. Moreover, the patterned array of ESD protection circuits 203 may include devices such as zener diodes, metal oxide varistors (MOVs), transient voltage suppression (TVS) diodes, and regular complementary metal oxide semiconductor (CMOS) or bipolar clamp diodes. In some embodiments, the array of ESD protection circuits 203 may be patterned on a conductive metal layer 205 embedded within the carrier wafer 201. In various embodiments, the conductive metal layer 205 may be formed of a conductive material comprising copper (Cu), aluminum (Al), silver (Ag), gold (Au), tungsten (W), or alloys thereof. In some embodiments, the conductive metal layer 205 can be formed by a process such as electric plating, chemical solution deposition, PVD, CVD, ALD and PECVD.

In further embodiments, electrical connections 207 between the array of ESD protection circuits 203 patterned on the carrier wafer 201 and the array of sensitive devices 211 patterned on the device wafer 209 may be provided. In some embodiments, the electrical connections 207 may be solder balls, bumps, columns, pillars, or other structures formed from a conductive material, such as solder, metal, or metal alloy to facilitate electrical connections. In some embodiments, the electrical connections 207 may facilitate electrical connections to a power supply node VDD and the ground node VSS as well as to input/output pins.

Figures 3A, 3B:
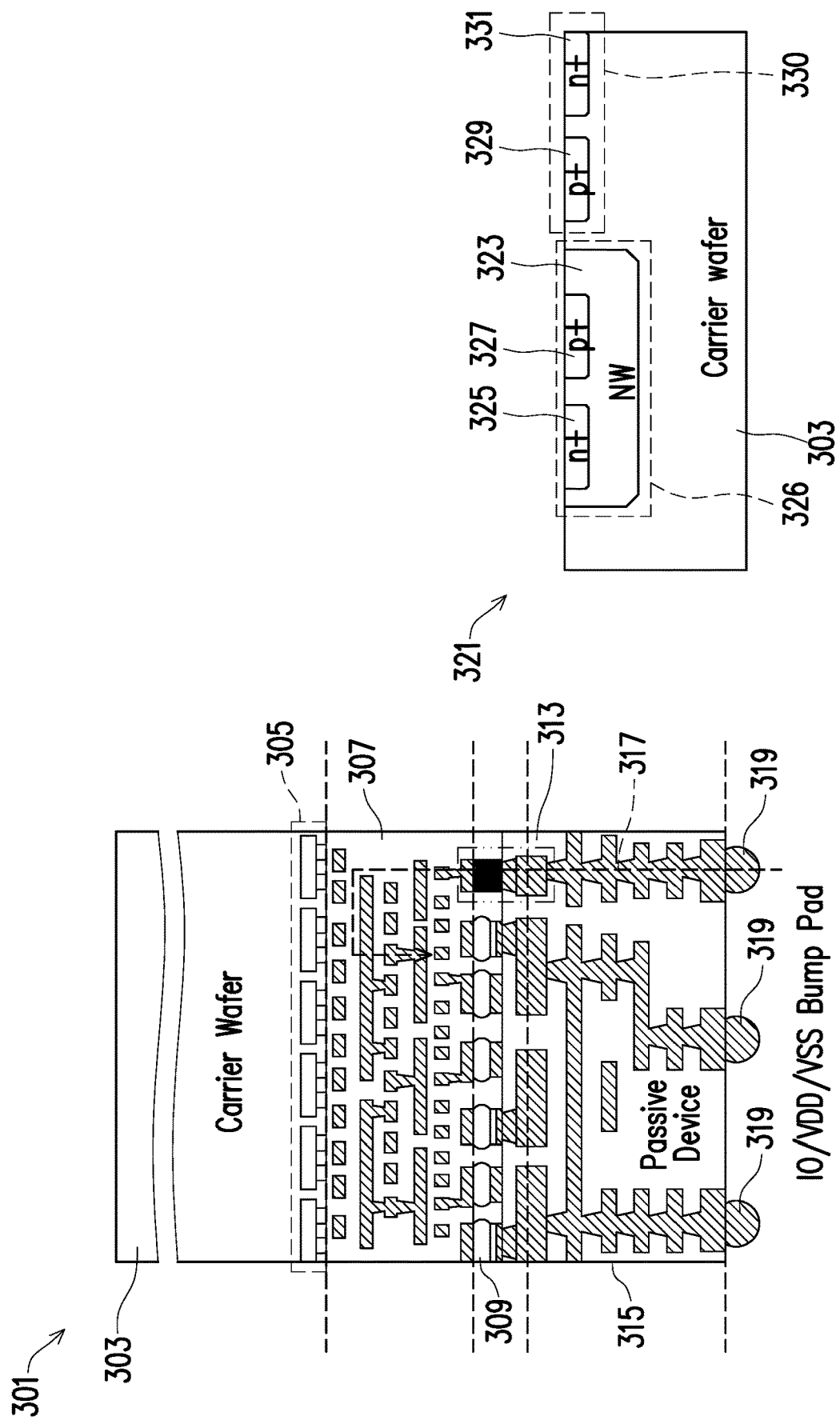
FIG. 3A illustrate a cross-sectional view of a semiconductor device with an ESD array implemented in a carrier wafer, in accordance with some embodiments of the present disclosure.
FIG. 3B illustrates a cross-sectional view of a portion of an ESD array implemented in a carrier wafer, in accordance with some embodiments.

FIG. 3A illustrate a cross-sectional view of a semiconductor device 301 with an ESD array 305 implemented in a carrier wafer 303, in accordance with some embodiments of the present disclosure. As shown in FIG. 3A, the ESD array 305 implemented in the carrier wafer 303 increases the routing resources in the device wafer thereby freeing up a space for integrating more functionality into the semiconductor device 301.

According to one embodiment, the semiconductor device 301 may include a back-end-of-line (BEOL) layer 307 comprising contacts, insulating layers, multiple metal levels, and bonding sites configured to interconnect integrated circuits and microdevices fabricated in a front-end-of-line ("FEOL") portion of a FEOL and mid-end-of-line ("MEOL") portion of layer 309. In some embodiments, the BEOL layer 307 is formed under the array of ESD protection circuits.

In some embodiments, FEOL portion of the layer 309 comprises a semiconductor substrate and the interconnect rails that are partially buried in the semiconductor substrate. In some embodiments, the MEOL portion of the layer 309 may include gate contacts as well as contact structures connected to the source and drain regions of the integrated circuits formed in the FEOL portion of the layer 309. In some embodiments, the FEOL and MEOL layer 309 is formed under the BEOL layer 307.

In various embodiments, the semiconductor device 301 may include a power delivery network ("PDN") layer 315 that is formed for delivering power to the individual integrated circuits and microdevices. In some embodiments, the PDN layer 315 is formed under the front-end-of-line ("FEOL") and mid-end-of-line ("MEOL") layer 309. In some embodiments, the PDN layer is formed as part of the device layer 117 of FIG. 1. Moreover, the power delivery network in the PDN layer 315 may be connected to the buried interconnect rails of the FEOL layer by way of metal-filled TSVs (Through-Semiconductor Vias) or by way of damascene-type contacts. Moreover, the FEOL and MEOL layer 309 may also include layer interconnect vias 313 configured to route signals from the PDN layer 315 to the BEOL layer 307. In some embodiments, the layer interconnect vias 313 may be shielded from the integrated circuits and their interconnects formed in the FEOL and MEOL layer 309.

In further embodiments, the semiconductor device 301 may also include multiple solder bump terminals 319, called bump pads, which are used as the input/output (I/O) terminals as well as power supply (VDD and VSS) contacts. In one embodiment, the solder bump pads 319 may be formed over the bottom surface of the PDN layer 315. In some embodiments, the solder bump pads 319 may be linearly aligned bump pad arrays, where each linearly aligned bump pad array may have one or more I/O bump pads, one or more VDD bump pads, and one or more VSS bump pads.

As illustrated in FIG. 3A, during an ESD event, an ESD signal 317 may be routed through the PDN layer 315, the FEOL and MEOL layer 309, and the BEOL layer 307 to the ESD array 305 thereby protecting internal integrated circuits and microdevices from an ESD event occurring at the bump pads 319. Some exemplary advantages of the structure shown in FIG. 3A may include an ESD signal routing approach to the ESD array 305 that minimizes the effects of parasitic discharge elements that may be present inside the internal integrated circuits and microdevices. For example, the ESD signal 317 routing approach shown in FIG. 3A shields the internal integrated circuits from the parasitic discharging elements present in the FEOL and MEOL layer 309. Additionally, the structure of FIG. 3A may provide a customized metal routing/scheme for the ESD signal 317. Another exemplary advantage of the structure shown in FIG. 3A includes an increase of the routing resources in the device wafer that can be used for application specific circuits.

FIG. 3B illustrates a cross-sectional view of a portion of an ESD array 321 implemented in a carrier wafer 303, in accordance with some embodiments. As such, the exemplary portion of the ESD array 321 shown in the FIG. 3B includes one or more diodes formed in a silicon substrate 303 of the carrier wafer. Moreover, at least one of the one or more diodes may be n-type diode. In this regard, an n-type diode 326 may be formed within an n-wall region 323. In some embodiments, the n-wall region 323 may be doped simultaneously with the doping step employed to produce n-wells in the substrate for fabricating PMOS circuits and thus no additional fabrication steps need to be added to a standard complementary metal-oxide semiconductor (CMOS) fabrication process. In some embodiments, the n-wall region 323 of the n-type diode 326 may include a cathode 325 and an anode 327 region. The cathode region 325 may be doped with n-type dopant and the anode region 327 may be doped with p-type dopant. In some embodiments, p-type dopants may be chosen from the Group III elements (such as boron, gallium, etc.) and n-type dopants may be chosen from the Group V elements (such as arsenic and phosphorus, etc.). As another example, the ESD array 321 may also include a p-type diode 330 formed in the substrate 303 of the carrier wafer. As illustrated in FIG. 3B, the p-type diode 330 may be constructed between an anode p+ doped region 329 and a cathode n+ doped area 331.

Figures 4A, 4B:
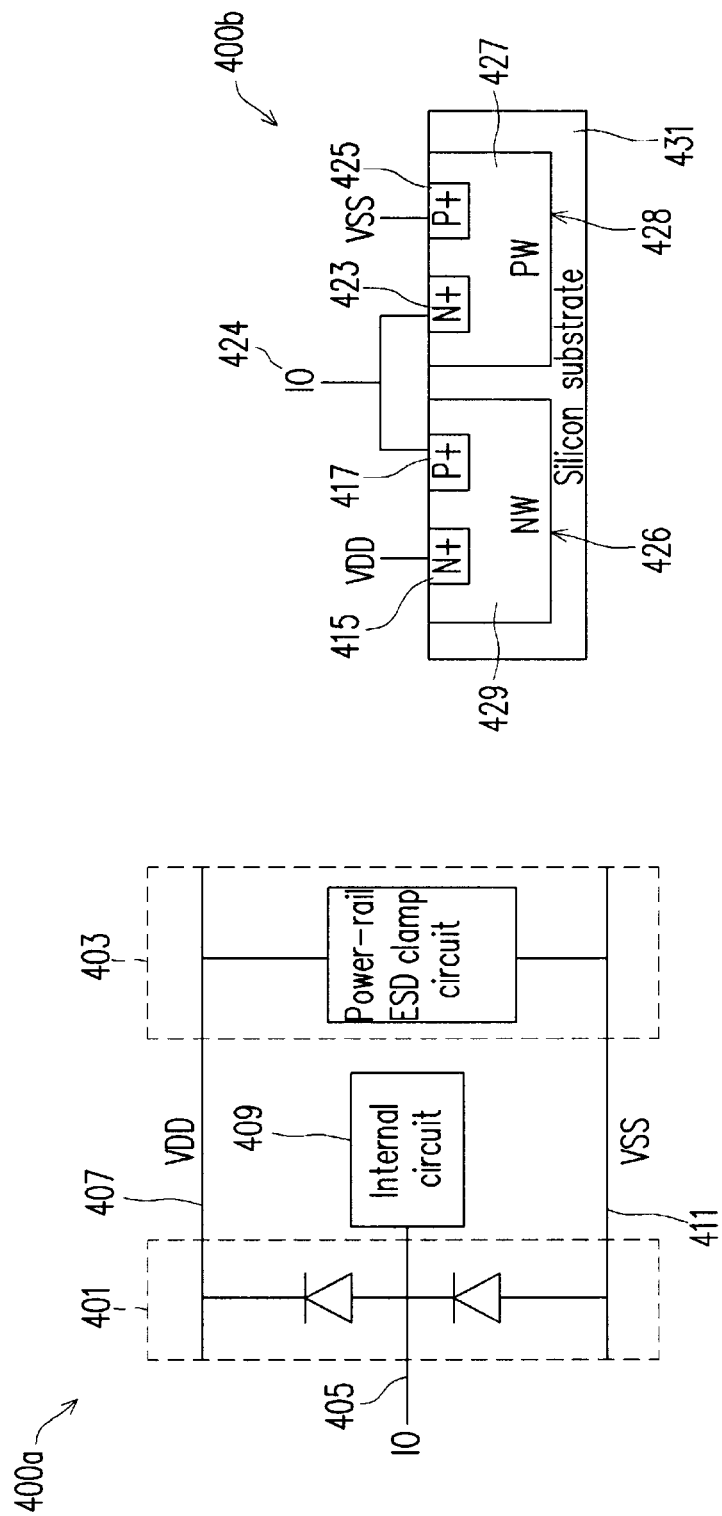
FIG. 4A illustrates a schematic circuit diagram of an ESD protection circuit, in accordance with some embodiments of the present disclosure.
FIG. 4B illustrates a cross-section of a diode based ESD protection circuit, in accordance with some embodiments.

FIG. 4A illustrates a schematic circuit diagram of an ESD protection circuit 400a that includes a diode based ESD protection circuit 401, an internal circuit 409, and an ESD power clamp circuit 403 that can be implemented as part of an ESD array formed on a carrier wafer, in accordance with some embodiments of the present disclosure. In some embodiments, the diode based ESD protection circuit 401 may include diodes coupled in series between high and low power supply rails or nodes 407 and 411, respectively, which may be respectively set at VDD and VSS. As illustrated in FIG. 4A, the ESD protection circuit 400a incudes the internal circuit(s) 409 that is configured to receive an input signal from an input pad 405, which is coupled to internal circuit(s) 409 through the diode based ESD protection circuit 401. As further shown in FIG. 4A, the diode based ESD protection circuit 401 provides pathway for an ESD current to flow to ground away from internal circuit(s) 409. Moreover, in various embodiments, the ESD power clamp circuit 403 may be coupled in parallel with internal circuit(s) 409 between the high and low power supply nodes 407 and 411 and further configured to channel away from the internal circuit(s) 409 the high current generated in response to an ESD event between the high and low power supply nodes 407 and 411. In further embodiments, the ESD protection circuit 400a can be implemented in the carrier wafer thereby increasing the routing resources in the device wafer for other application specific circuits.

FIG. 4B illustrates a cross-section of a diode based ESD protection circuit 401 that can be implemented as part of an ESD array formed on a carrier wafer, in accordance with some embodiments. As such, a cross-sectional view 400b of the ESD protection circuit 401 is configured to pass an ESD current between an input/output pin 424 and the power rail 425, which may be set to a voltage that is zero (the ground) or around zero.

In some embodiments, as shown in the cross-sectional view 400b, the ESD circuit 401 includes a silicon substrate 431 having multiple doped regions of opposite polarity, each region being doped relative to the others to suit particular applications. As shown in FIG. 4B, the ESD circuit 401 may include two diffusion regions 427 and 429, which are formed in the silicon substrate 431 and doped to the opposite polarities. Within each of the diffusion regions 427 and 429 a pair of anode regions 417 and 425 doped with p-type dopant may be formed. In some embodiments, p-type dopants may be chosen from the Group III elements (such as boron, gallium, etc.) that will create holes in the doped region and result in an electrically conductive p-type semiconductor. Moreover, the ESD circuit 401 may also include a pair of cathode regions 415 and 423 doped with n-type dopant. In some embodiments, n-type dopants may be chosen from the Group V elements (such as arsenic and phosphorus, etc.) that will generate valence electrons and make the cathode regions 415 and 423 "n-type" (where the electron concentration is larger than the hole concentration at thermal equilibrium).

Referring again to FIG. 4B, the cathode region 415 of a first diode 426 formed in the diffusion region 429 may be coupled to a power rail VDD and the anode region 425 of a second diode 428 formed in the diffusion region 427 may be coupled to low power or ground rail VSS. In some embodiments, the first diode 426 may be configured as an n-type diode whereas the second diode 428 may be configured as a p-type diode as will be understood by one skilled in the art.

Figure 5B:
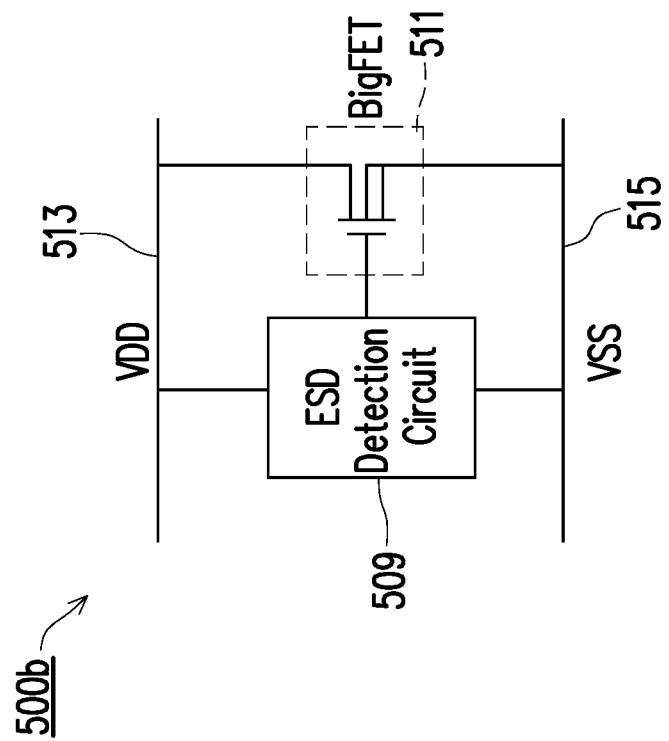
FIG. 5B illustrates a schematic circuit diagram of an ESD detection and trigger circuit with a bigFET configured to conduct an ESD current during an ESD event, in accordance with some embodiments.
Figure 5A:
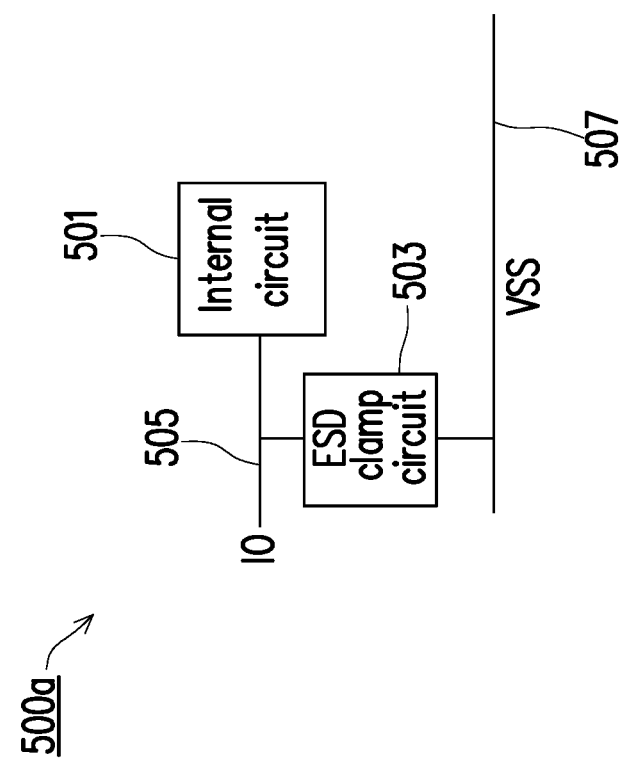
FIG. 5A illustrates a schematic circuit diagram of an ESD power clamp circuit connected between an input/output (TO) pad and a power rail, in accordance with some embodiments.

FIG. 5A illustrates a schematic circuit diagram of an exemplary ESD protection circuit 500a comprising an ESD power clamp circuit 503 connected between an input/output (IO) pad 505 and a power rail 507 that can be implemented as part of an ESD array formed on a carrier wafer, in accordance with some embodiments. As shown FIG. 5A, the ESD power clamp circuit 503 provides a discharge path from the IO pad 505 to the power rail 507, which may be set to a voltage that is zero (the ground) or around zero. In this embodiment, the ESD power clamp circuit 503 protects the internal circuit 501 from an ESD received on the IO pad 505. In some embodiments, the ESD array 321 (FIG. 3A) patterned in the carrier wafer may be implemented as an array of ESD power clamp circuits 503. More specifically, an array of the ESD protection circuits 500a can be implemented in the carrier wafer thereby increasing the routing resources in the device wafer for other application specific circuits.

FIG. 5B illustrates a schematic circuit diagram of an ESD protection circuit 500b comprising an ESD detection and trigger circuit 509 and a bigFET 511 configured to conduct an ESD current during an ESD event, in accordance with some embodiments. In some embodiments, the bigFET 511 is an n-channel MOSFET (NMOS) transistor with a large channel width. However, it is also possible to use a p-channel MOSFET (PMOS) transistor with a large channel width as a bigFET. The ESD protection circuit 500b can be used to protect a supply rail of an IC chip from overheating during an ESD event by shunting the ESD current from the supply rail to ground. As shown in FIG. 5B, the ESD detection and trigger circuit 509 and the bigFET 511 may be connected between supply voltages. More specifically, the ESD detection and trigger circuit 509 and the bigFET 511 may be connected to a supply voltage, "VDD," at a power supply VDD node (e.g., a terminal or an input pad) 513 and a lower voltage, "VSS," at a voltage VSS node 515, which is set to a voltage that is zero (the ground) or around zero.

In the embodiment shown in FIG. 5B, the gate terminal, "G," of the bigFET 511 is connected to and controlled by the ESD detection and trigger circuit 509. As such, ESD detection and trigger circuit 509 pulls up the gate terminal, "G," of the bigFET 511 at the start of an ESD event such that the bigFET 511 shunts the ESD current from the VDD node 513 to the VSS node 515 during the ESD event. In some embodiments, the channel width of the bigFET 511 may be configured such that the entire ESD current caused by the ESD event flows through the bigFET 511 so as to prevent ESD damage to all of the other circuits connected between the VDD node 513 and the VSS node 515. Moreover, the bigFET 511 may be configured to keep the voltage drop generated across the bigFET 511 below a pre-determined critical value, which may be set to a value between 50% and 150% of the nominal value of the supply voltage VDD. In some embodiments, the ESD array 321 (FIG. 3A) patterned in the carrier wafer may be implemented as an array of ESD protection circuits 500b. As such, an array of the ESD protection circuits 500a implemented in the carrier wafer can increase the routing resources in the device wafer for other application specific circuits.

FIG. 6A illustrates an ESD power clamp circuit 600a that can be implemented as part of an ESD array formed on a carrier wafer, in accordance with some embodiments. In some embodiments, the ESD power clamp circuit 600a includes a high-current-capacity field-effect transistor (FET) 607 electrically connected across high (e.g., a VDD pin) and low (e.g., a VSS pin) power supply nodes 601 and 603, respectively. In accordance with other embodiments, the ESD power clamp circuit 600a may include a plurality high-current-capacity field-effect transistors (FETs) connected in series between the power supply nodes 601 and 603. In further embodiments, the FET transistor 607 may provide a current path for discharging current from the high power supply node 601 during an ESD event. As such, the FET transistor 607 may have a channel width on the order of 2,000 micrometer (μm) to 9,000 micrometer (μm) in order to handle the large current present during an ESD event.

Moreover, as shown in FIG. 6A, the ESD power clamp circuit 600a includes an RC trigger network 605 comprising of a capacitor 609 in series with a resistor 611. The RC trigger network 605 is connected between the high and low power supply nodes 601 and 603, respectively. The ESD power clamp circuit 600a further includes two transistors 613 (e.g., PMOS) and 615 (e.g., NMOS) forming an inverter. In some embodiments, the gates of the transistors 613 and 615 are commonly coupled to a node 604. When an ESD event occurs and the voltage at the high power supply node 601 rises against the voltage at low power supply node 603. In addition, during an ESD event, the voltage of the node 604 is kept closed to voltage of the low power supply node 603 due to slow response of the capacitor 609 therefore causing the transistor 615 to turn off and the transistor 613 to turn on. Subsequently, the voltage at gate of the FET transistor 607 is pulled high by the turned-on transistor 613, and the FET transistor 607 is triggered to conduct current between the high and low power supply nodes 601 and 603 to provide an ESD clamping. In other embodiments, if the low power supply node 603 is subjected to an ESD event, an ESD current may flow through the intrinsic body-diode of the FET transistor 607. In some embodiments, the ESD arrays 203 and 305 shown in FIGS. 2 and 3A, respectively may be implemented as an array of ESD power clamp circuits 600a patterned in the carrier wafer. As such, the array of the ESD power clamp circuits implemented in the carrier wafer can increase the routing resources in the device wafer for other application specific circuits.

FIG. 6B illustrates an exemplary ESD power clamp circuit 600b, in accordance with some embodiments. As shown in FIG. 6B, the ESD power clamp circuit 600b, includes a trigger network 617 comprising a resistor 621 connected in series with a capacitor 619. The trigger network 617 may be coupled between the high and low power supply nodes 601 and 603, respectively. Moreover, the trigger network 617 may drive a gate of the FET transistor 607 (FIG. 6A), e.g., an n-channel MOS (Metal-Oxide-Semiconductor) transistor during an ESD event. As such, when an ESD event occurs, the voltage of the high power supply node 601 rises against the low power supply node 603 and causes the FET transistor 607 to turned on. In some embodiments, the ESD arrays 203 and 305 shown in FIGS. 2 and 3A, respectively may be implemented as an array of ESD power clamp circuits 600b patterned in the carrier wafer.

FIG. 6C illustrates an exemplary ESD power clamp circuit 600c, in accordance with some embodiments. As shown in FIG. 6C, the ESD power clamp circuit 600c may include a diode based trigger network 623. In some embodiments, the diode based trigger network 623 may include one or more diodes 627 connected in series with their anodes oriented towards the high power supply node 601 and their cathodes oriented towards the low power supply node 603. Moreover, the diode based trigger network 623 may also include a resistor 625 connected between the one or more diodes 627 and the low power supply node 603. In addition, the ESD power clamp circuit 600c may also include the FET transistor 607 (discussed in FIG. 6A) with its gate connected to node between the one or more diodes 627 and the resistor 625.

In operation, the diode based trigger network 623 is configured to drive the FET transistor 607 when the voltage across the resistor 625 reaches a predetermined level to turn on the FET transistor 607. As such, a trigger voltage that causes the FET transistor 607 to conduct current from the high power supply node 601 to the low power supply node 603 is determined by the number of the diodes 627 connected in series and the threshold voltage of the FET transistor 607. In this regard, during the ESD event, when the voltage on the high power supply node 601 approaches the trigger voltage, the FET transistor 607 conduct a relatively large amount of current. Furthermore, in some embodiments, the trigger voltage can be programmed by adjusting the number of diodes, or by adjusting the breakdown voltage of one or more diodes 627 used in place of one or more of the normal diodes in another embodiment. In some embodiments, the ESD arrays 203 and 305 shown in FIGS. 2 and 3A, respectively may be implemented as an array of ESD power clamp circuits 600c patterned in the carrier wafer.

Figure 7:
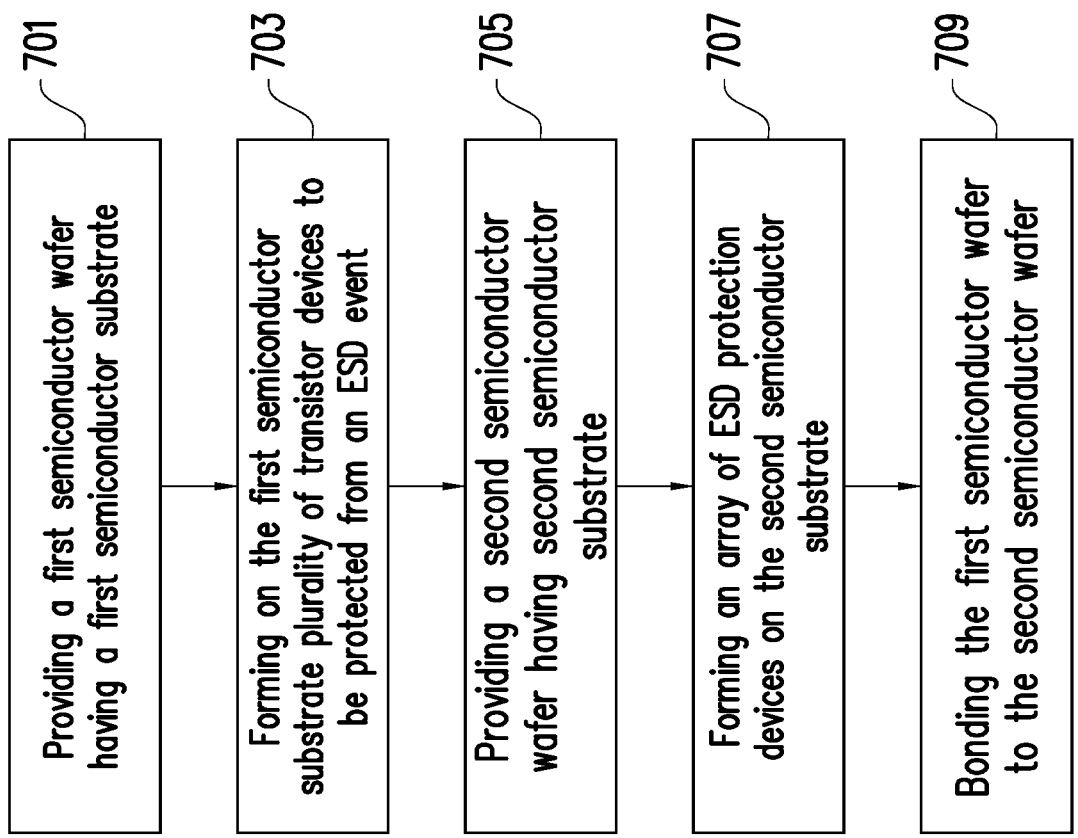
FIG. 7 illustrates a flow diagram of an electrostatic discharge (ESD) protection device a forming method, in accordance with some embodiments.

FIG. 7 illustrates a flow diagram of a method of forming an electrostatic discharge (ESD) protection device, in accordance with some embodiments. Although the exemplary method shown in FIG. 7 is described in relation to FIGS. 1-6, it will be appreciated that this exemplary method is not limited to such structures disclosed in FIGS. 1-6 and may stand alone independent of the structures disclosed in FIGS. 1-6. In addition, some operations of the exemplary method illustrated in FIG. 7 may occur in different orders and/or concurrently with other operations or events apart from those illustrated and/or described herein. Moreover, not all illustrated operations may be required to implement one or more aspects or embodiments of the present disclosure. Further, one or more of the operations depicted herein may be carried out in one or more separate operations and/or phases.

At operation 701, a first semiconductor wafer having a first semiconductor substrate is provided. In some embodiments, the first semiconductor wafer may include transistor devices to be protected from an ESD event. In various embodiments, the transistor devices may form an integrated circuit or a microdevice.

At operation 703, a plurality of transistor devices to be protected from an ESD event may be formed on the first semiconductor substrate. In some embodiments, the first semiconductor substrate of the first semiconductor wafer may be formed on top of a power delivery network (PDN) layer that is configured to deliver power to the plurality of transistor devices formed in the first semiconductor substrate. Furthermore, according to some embodiments, interconnections for the plurality of transistor devices formed in the first semiconductor substrate may be patterned on a back-end-of-line (BEOL) layer formed on a top surface of the first semiconductor substrate.

At operation 705, a second semiconductor wafer having second semiconductor substrate may be provided. In further embodiments, the first and second semiconductor wafers may be fabricated using different semiconductor manufacturing processes.

At operation 707, an array of ESD protection devices may be formed on the second semiconductor substrate. In some embodiments, the array of the ESD protection devices may include an ESD power clamp circuit coupled between the high and low power supply nodes and further configured to channel away from the plurality of transistor devices in the first semiconductor substrate the high current generated in response to an ESD event between the high and low power supply nodes. Moreover, in some exemplary embodiments, at least one of the ESD protection devices formed during the operation 707 may include a trigger network having a plurality of zener diodes connected in series and configured to detect an ESD event. Furthermore, the trigger network may be further configured to drive a field-effect transistor (FET) when a transient voltage caused by the ESD event reaches a predetermined voltage level.

In further exemplary embodiments, the forming of the array of the ESD protection devices at operation 707 may further include forming a plurality of semiconductor wells in the second semiconductor substrate of the second semiconductor wafer and forming a first and second doped regions having dopants of opposite type in the plurality of semiconductor wells. In some embodiments, the first and second doped regions are electrically connected between a high power supply rail and a low power supply rail.

At operation 709, the first semiconductor wafer is bonded to the second semiconductor wafer. In some embodiments, the first semiconductor wafer may be a device wafer and the second semiconductor wafer may be a carrier wafer. Moreover, during the bonding operation 709, the front surfaces of the carrier wafer and device wafer may be placed in contact with one another and bonded via thermal compression bonding. In some exemplary wafer stack formation process, the carrier wafer may be bonded to a High Density Plasma (HDP) oxide layer of the device wafer during the wafer bonding operation 709.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations are used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, signal, etc. that is physically constructed, programmed, arranged and/or formatted to perform the specified operation or function.

Furthermore, a person of ordinary skill in the art would understand that various illustrative logical blocks, modules, devices, components and circuits described herein can be implemented within or performed by an integrated circuit (IC) that can include a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A processor programmed to perform the functions herein will become a specially programmed, or special-purpose processor, and can be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the present disclosure.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. An apparatus comprising:
an internal circuit patterned in a device wafer and electrically coupled between a first contact node and a second contact node,
wherein the first and second contact nodes are fabricated during a mid-end-of-line (MEOL) fabrication process for the device wafer; and
an array of electrostatic discharge (ESD) circuits patterned in a carrier wafer,
wherein the ESD circuits are electrically coupled, through a first and second vertical conductive paths (vias) fabricated during a back end-of-line (BEOL) fabrication process for the device wafer, between the first contact node and the second contact node and are configured to route an ESD signal through the first via and a first metal-filled through-semiconductor via connected to a bump pad formed in the device wafer, and
wherein the device wafer is bonded to the carrier wafer.

2. The apparatus of claim 1, wherein the first contact node is connected to a high power supply rail through the first metal-filled semiconductor via and the second contact node is connected through a second metal-filled through-semiconductor via to a low power supply rail.

3. The apparatus of claim 2, wherein the ESD circuits comprise of an array of diodes electrically coupled in series between the high and low power supply rails and configured to provide a pathway for an ESD current to flow to the low power supply rail through the first metal-filled through-semiconductor via.

4. The apparatus of claim 1, wherein the ESD circuits further include ESD power clamp circuits electrically coupled between the first contact node and the second contact node through the first and second vias.

5. The apparatus of claim 4, wherein at least one of the ESD power clamp circuits further comprises:
   an ESD detection circuit comprising of a resistor in series with a capacitor and configured to detect a transient ESD event;
   an inverter having an input connected to the ESD detection circuit; and
   a field-effect transistor (FET) transistor having a gate connected to an output of the inverter and configured to provide a pathway for an ESD current to flow to the low power supply rail through the first metal-filled through-semiconductor via.

6. An apparatus including an electrostatic discharge (ESD) protection device comprising:
   a device wafer having integrated circuits patterned therein; and
   a carrier wafer bonded to the device wafer, wherein the carrier wafer comprises one or more ESD protection devices fabricated during a front end-of-line (FOEL) fabrication process for the carrier wafer and configured to clamp an ESD voltage during an ESD event so as to protect the integrated circuits from the ESD event, wherein the one or more ESD protection devices are formed in semiconductor wells positioned in a silicon substrate of the carrier wafer and configured to route an ESD signal originating from the ESD event through a vertical conductive path (via) fabricated during a back end-of-line (BEOL) fabrication process of the device wafer and a metal-filled through-semiconductor via connected to a bump pad formed in the device wafer.

7. The apparatus of claim 6, wherein the device wafer further comprises metallization layers fabricated during the BEOL fabrication process and configured to interconnect the integrated circuits.

8. The apparatus of claim 6, wherein the one or more ESD protection devices are electrically connected between a high power supply rail and a low power supply rail through the metal-filled through-semiconductor via.

9. The apparatus of claim 6, wherein the one or more ESD protection devices include a plurality of diodes coupled in series.

10. The apparatus of claim 6, wherein at least one of the one or more ESD protection devices includes a trigger network having a plurality of zener diodes and configured to detect an ESD event.

11. The apparatus of claim 9, wherein the trigger network is configured to drive a field-effect transistor (FET) fabricated during the FEOL fabrication process for the device wafer when a transient voltage caused by the ESD event reaches a predetermined voltage level.

12. The apparatus of claim 11, wherein the predetermined voltage level is determined based on a number of the zener diodes connected in series.

13. The apparatus of claim 10, wherein the ESD protection device is configured to provide a current path to the bump pad through the via fabricated during the BEOL fabrication process of the device wafer and the metal-filled through-semiconductor via during the ESD event.

14. The apparatus of claim 10, wherein interconnections for the array of the ESD protection devices are patterned on a conductive metal layer formed in the carrier wafer.

15. A method of forming an electrostatic discharge (ESD) protection device comprising:
   providing a first semiconductor wafer having a first semiconductor substrate;
   forming on the first semiconductor substrate a plurality of transistor devices to be protected from an ESD event;
   providing a second semiconductor wafer having a second semiconductor substrate;
   forming an array of ESD protection devices on the second semiconductor substrate and configured to route an ESD signal originating from the ESD event through one or more vertical conductive paths (vias) fabricated during a back end-of-line (BEOL) fabrication process and one or more metal-filled through-semiconductor vias extended from a top surface of the first semiconductor substrate to a bottom surface of the first semiconductor substrate and connected to bump pads formed over the bottom surface of the first semiconductor substrate; and
   bonding the first semiconductor wafer to the second semiconductor wafer.

16. The method of claim 15, wherein forming the array of the ESD protection devices further comprises:
   forming a plurality of semiconductor wells in the second semiconductor substrate of the second semiconductor wafer;
   forming a first and second doped regions having dopants of opposite type in the plurality of semiconductor wells;
   wherein the first and second doped regions are electrically connected through the one or more metal-filled through-semiconductor vias to a high power supply rail and a low power supply rail.

17. The method of claim 15, wherein the first semiconductor substrate is formed on a top surface of a power delivery network (PDN) layer configured to deliver power to the plurality of transistor devices formed in the first semiconductor substrate.

18. The method of claim 15, wherein forming at least one of the ESD protection devices includes forming a trigger network having a plurality of zener diodes connected in series and configured to detect an ESD event.

19. The method of claim 18, wherein the trigger network is further configured to drive a field-effect transistor (FET) when a transient voltage caused by the ESD event reaches a predetermined voltage level.

20. The method of claim 15, wherein interconnections for the plurality of transistor devices formed in the first semiconductor substrate are patterned during the back-end-of-line (BEOL) fabrication process and are formed on the top surface of the first semiconductor substrate.

* * * * *